(12) United States Patent
Okuno

(10) Patent No.: US 12,647,119 B2
(45) Date of Patent: Jun. 2, 2026

(54) DELAY LOCKED LOOP AND SEMICONDUCTOR MEMORY DEVICE

(71) Applicant: Winbond Electronics Corp., Taichung City (TW)

(72) Inventor: Shinya Okuno, Yokohama (JP)

(73) Assignee: WINBOND ELECTRONICS CORP., Taichung City (TW)

(\*) Notice: Subject to any disclaimer, the term of this patent is extended or adjusted under 35 U.S.C. 154(b) by 112 days.

(21) Appl. No.: 18/756,555

(22) Filed: Jun. 27, 2024

(65) Prior Publication Data

US 2025/0038750 A1     Jan. 30, 2025

(30) Foreign Application Priority Data

Jul. 28, 2023    (JP) ................................. 2023-123272

(51) Int. Cl.
   *G11C 11/4076*        (2006.01)
   *H03K 5/133*        (2014.01)
               (Continued)

(52) U.S. Cl.
   CPC ........ *H03L 7/0816* (2013.01); *G11C 11/4076* (2013.01); *H03K 5/133* (2013.01);
               (Continued)

(58) Field of Classification Search
   CPC ..... H03L 7/0816; H03L 7/085; H03L 7/0814; H03L 7/081; G11C 11/4076; G11C 7/222;
               (Continued)

(56) References Cited

U.S. PATENT DOCUMENTS 6,160,456 A \* 12/2000 Chang .................. H03L 7/0891
                                                          331/25
6,489,823 B2 \* 12/2002 Iwamoto ............... H03L 7/0814
                                                          331/25
                  (Continued)

FOREIGN PATENT DOCUMENTS

CN         113904680 A      1/2022
CN         115083458 A      9/2022
               (Continued)

OTHER PUBLICATIONS

Japanese Office Action for Japanese Application No. 2023-123272, dated Sep. 17, 2024, with English translation.
(Continued)

*Primary Examiner* — Khamdan N. Alrobaie
(74) *Attorney, Agent, or Firm* — Birch, Stewart, Kolasch & Birch, LLP

(57)        ABSTRACT

The present invention provides a delay locked loop (DLL) that can complete the process of adjusting the delay of an internal clock signal within a predetermined execution period. The DLL includes a DLL control circuit and a delay line circuit. The DLL control circuit sets the delay amount based on the phase difference between an input clock signal and an output clock signal. The delay line circuit performs a delay operation on the input clock signal according to the delay amount, thereby generating the output clock signal. The delay line circuit includes a plurality of delay units, each delay unit includes at least one delay element, and one of the delay units includes a greater number of delay elements than another delay unit.

18 Claims, 3 Drawing Sheets

(51) Int. Cl.

| | | |
|---|---|---|
| *H03L 7/081* | (2006.01) | |
| *H03L 7/085* | (2006.01) | |
| *H03K 5/00* | (2006.01) | |

(52) U.S. Cl.
CPC .... *H03L 7/085* (2013.01); *H03K 2005/00019*
(2013.01); *H03K 2005/0015* (2013.01)

(58) Field of Classification Search
CPC .......... G11C 16/32; G11C 2207/2272; H03K
5/133; H03K 2005/00019; H03K
2005/0015
See application file for complete search history.

(56) References Cited

U.S. PATENT DOCUMENTS

| | | | | |
|---|---|---|---|---|
| 7,253,672 | B2 * | 8/2007 | Gomm | G11C 7/22 |
| | | | | 327/261 |
| 8,237,474 | B2 * | 8/2012 | Gomm | G11C 7/22 |
| | | | | 327/158 |
| 10,686,582 | B1 | 6/2020 | Pasdast et al. | |
| 2002/0015338 | A1 * | 2/2002 | Lee | G11C 7/1066 |
| | | | | 365/200 |
| 2002/0190767 | A1 * | 12/2002 | Gomm | G11C 7/222 |
| | | | | 327/161 |
| 2003/0117188 | A1 * | 6/2003 | Nakanishi | H03L 7/0805 |
| | | | | 327/141 |
| 2004/0239388 | A1 * | 12/2004 | Lee | H03K 5/131 |
| | | | | 327/158 |
| 2005/0184776 | A1 | 8/2005 | Pilo et al. | |
| 2006/0044029 | A1 * | 3/2006 | Gomm | H03L 7/0818 |
| | | | | 327/153 |
| 2024/0014822 | A1 * | 1/2024 | Okuno | H03L 7/0812 |
| 2024/0242753 | A1 * | 7/2024 | Okuno | H03L 7/183 |

FOREIGN PATENT DOCUMENTS

| | | | |
|---|---|---|---|
| JP | 2003-198339 | A | 7/2003 |
| JP | 2015-35241 | A | 2/2015 |
| KR | 10-1997-0076843 | A | 12/1997 |
| KR | 10-2007-0036549 | A | 4/2007 |
| TW | I617137 | B | 3/2018 |
| TW | I732558 | B | 7/2021 |
| WO | WO 2013/122221 | A1 | 8/2013 |

OTHER PUBLICATIONS

Korean Office Action for Korean Application No. 10-2024-0095825, dated Mar. 13, 2025, with English translation.

* cited by examiner

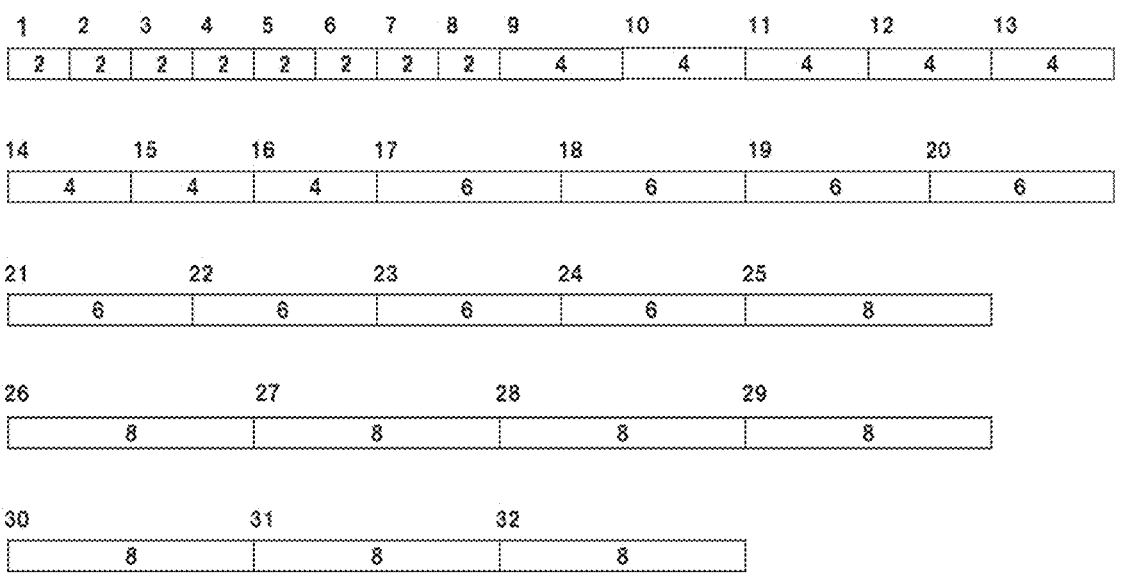
FIG. 3
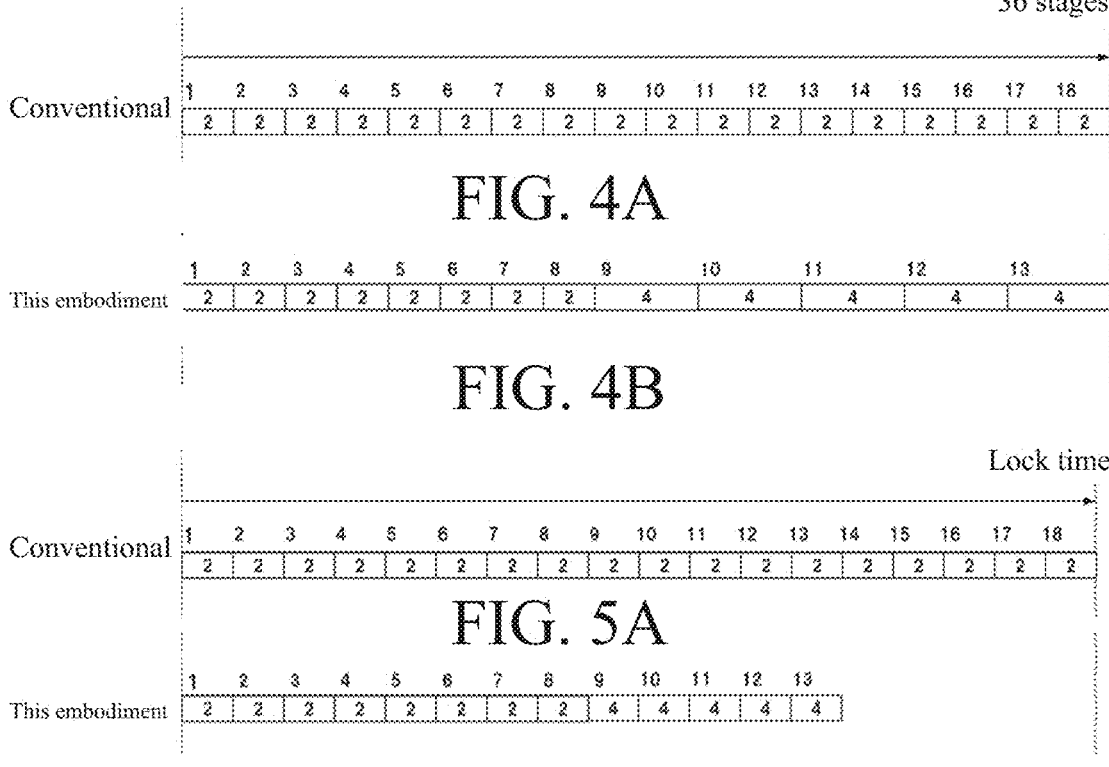
FIG. 4A
FIG. 4B
FIG. 5A
FIG. 5B

DELAY LOCKED LOOP AND SEMICONDUCTOR MEMORY DEVICE

CROSS REFERENCE TO RELATED APPLICATIONS

This application claims priority of Japanese Patent Application No. 2023-123272, filed on Jul. 28, 2023, the entirety of which is incorporated by reference herein.

BACKGROUND OF THE INVENTION

Field of the Invention

The present invention relates to a delay locked loop and a semiconductor memory device.

Description of the Related Art

DRAM (Dynamic Random Access Memory) is a semiconductor memory device which stores information by storing charges in a capacitor, and the stored information is not retained when the power supplied to the DRAM is cut off. Japanese Patent Application Publication No. 2015-35241 discloses a delay locked loop (DLL) in a conventional DRAM. An internal clock signal can be generated in the DRAM through the DLL for outputting data signals in synchronization with an external clock signal.

In a conventional DRAM, when the DLL is used to adjust the delay of the internal clock signal, the following exemplary DLL sequence will be performed: the DLL reset operation, the DLL delay (lock) operation (for example, simultaneously activating the delay lines one by one, and synchronizing the external clock and the internal clock), and the N value detection operation to detect the N value corresponding to the number of delayed clock cycles between the input clock signal generated based on the external clock signal, and the internal clock signal.

The following formula can be used to express the lock time Td11 caused by the DLL delay operation.

$$Tint+Td11=N \times tCK$$

Tint represents the inherent delay time of the DLL, and tCK represents the clock cycle. When the clock cycle tCK is longer than the inherent delay time Tint due to a factor such as temperature in the semiconductor memory device, the lock time Td11 will be extended due to the DLL delay operation, as shown in the above formula. When the lock time Td11 is extended, the total execution time of the DLL sequence is likewise extended. The time extension may delay the execution of the next DLL sequence and may exceed the execution period tDLLK of the predetermined DLL sequence.

BRIEF SUMMARY OF THE INVENTION

In view of the above problems, an objective of the present invention is to provide a delay locked loop and a semiconductor memory device that can suppress the extension of the delay operation, and can complete the DLL sequence that adjusts the delay of the internal clock signal within a predetermined execution period.

According to the present invention, the delay lock loop (DLL) includes a DLL control circuit and a delay line circuit. The DLL control circuit sets the delay amount based on the phase difference between the input clock signal and the output clock signal. The delay line circuit receives the input clock signal, and is configured to perform a delay operation on the input clock signal according to the delay amount, thereby generating the output clock signal. The delay line circuit includes a plurality of delay units. Each of the delay units includes at least one delay element. One of the delay units includes a greater number of delay elements than another delay unit.

The semiconductor memory device of the present invention includes the aforementioned delay locked loop and an output buffer. The output buffer receives the output clock signal, and controls the output of data according to the output clock signal.

BRIEF DESCRIPTION OF THE DRAWINGS

FIG. 3 is a schematic diagram illustrating the relationship between the number of delay units and NAND gates of the delay line circuit according to the embodiment of the present invention.

FIG. 4A is a schematic diagram of the stage number of NAND gates required corresponding to the delay amount, in the conventional art.

FIG. 4B is a schematic diagram of the stage number of NAND gates required corresponding to the delay amount, according to the embodiment of the present invention.

FIG. 5A is a schematic diagram showing the lock time required for the corresponding delay amount in the conventional art.

FIG. 5B is a schematic diagram showing the lock time required for the corresponding delay amount according to the embodiment of the present invention.

DETAILED DESCRIPTION OF THE INVENTION

The delay locked loop and the semiconductor memory device according to some embodiments of the present invention will be described in detail below with reference to the accompanying drawings. These embodiments are only examples and are not intended to limit the present invention. In the following embodiments, the semiconductor memory device is, for example, DRAM.

Figure 1:
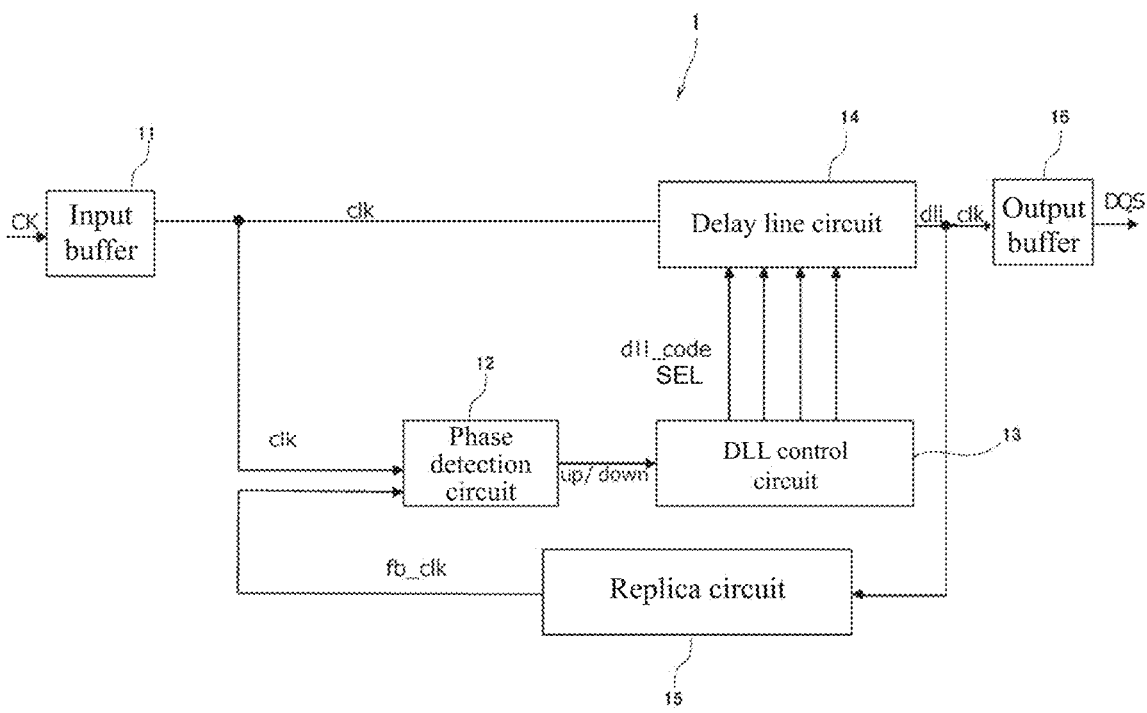
FIG. 1 is a block diagram of a structural example of a delay locked loop according to one embodiment of the present invention.

FIG. 1 shows a semiconductor memory device and a delay locked circuit 1 thereof, according to one embodiment of the present invention. In order to simplify the explanation, only the output buffer 16 of the semiconductor memory device is depicted, and other known structures (for example, command decoder, memory cell array, input and output interface part, etc.) provided in the semiconductor memory device are not shown in this embodiment.

The delay locked loop 1 includes an input buffer 11, a phase detection circuit 12, a DLL control circuit 13, a delay line circuit 14, and a replica circuit 15.

The input buffer 11 is configured to buffer the received external clock signal CK to generate the input clock signal clk. The input clock signal clk generated by the input buffer 11 will be provided to the delay line circuit 14 and the phase detection circuit 12. The delay line circuit 14 is configured to delay the input clock signal clk to generate a delay signal (hereinafter also referred to as an output clock signal) dll_clk, and provide the delay signal dll_clk to the output buffer 16 and the replica circuit 15. The replica circuit 15 is configured to generate the feedback signal fb_clk according to the delay signal dll_clk, and output the feedback signal fb_clk to the phase detection circuit 12.

The phase detection circuit 12 receives the input clock signal clk and the feedback signal fb_clk, and is configured to detect the phase difference between the input clock signal clk and the feedback signal fb_clk to generate a phase signal up/down. The phase detection circuit 12 provides the phase signal up/down to the DLL control circuit 13. The above mentioned phase signal up/down indicates whether the phase of the feedback signal fb_clk is leading or lagging relative to the input clock signal clk.

The DLL control circuit 13 is configured to determine the delay amount according to the phase signal up/down, to generate a control signal dll_code, and a selection control signal SEL. The control signal dll_code is composed of a plurality of bits, as used for indicating the amount of delay in the lock operation (an example of the "delay operation" of the present invention). The delay line circuit 14 receives the control signal dll_code and the selection control signal SEL.

The delay line circuit 14 includes a variable delay circuit for performing the lock operation. Each time after the DLL control circuit 13 sets the delay amount, the variable delay circuit delays the input clock signal clk to generate the delay signal dll_clk (the output clock signal) based on the delay amount (that is, based on the control signal dll_code and the selection control signal SEL), and outputs the delay signal dll_clk to the output buffer 16. The output buffer 16 controls the output of the data DQS according to the delay signal dll_clk.

Figure 2:
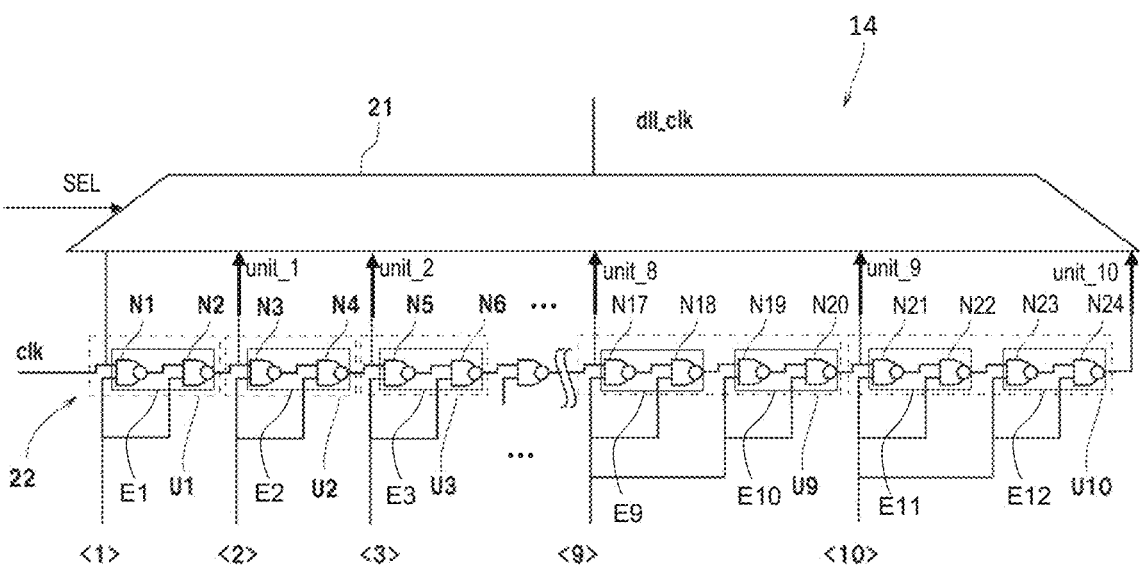
FIG. 2 is a structural diagram of a delay line circuit.

According to a first embodiment of the present invention, as shown in FIG. 2, the delay line circuit 14 includes n delay units U1 to Un (for example, U1 to U10), where n is a positive integer greater than 1. In the present embodiment, n is equal to 10, but is not limited thereto. Each of the delay units U1 to Un includes delay elements (for example, one or more of the delay elements E1 to E12), for delaying the input clock signal clk. In the delay units U1 to Un, at least one delay unit (for example, the delay unit U9) contains a greater number of delay elements (for example, E9 to E10) than the number of delay element (for example, the delay element E1) contained by other delay units (for example, the delay unit U1). In the present embodiment, each of the delay elements (for example, the delay elements E1 to E12) is composed of two NAND gates connected in series. The NAND gates Nm (for example, N1 to N24) are connected in series to construct the NAND gate row 22, where m is a positive integer greater than n). In the present embodiment, m is equal to 24, but is not limited thereto.

In the delay line circuit 14 of the present embodiment, the end side that receives the input clock signal clk is called the upstream side, and its opposite side is called the downstream side. In this embodiment, the NAND gate N1 located at the most upstream side of the NAND gate row 22 (the leftmost end of the NAND gate row 22 in FIG. 2) receives the input clock signal clk, and the other NAND gates (such as N2 to N24) respectively receive the output of the previous NAND gates (N1 to N23). For example, the NAND gate N2 receives the output of the NAND gate N1.

In addition, each of the delay units U1 to Un receives the code signals <1> to <n> (for example, <1> to <10>) of the control signal dll_code generated by the DLL control circuit 13, and inputs the same code signal (for example, <9>) to the NAND gates (for example, N17 to N20) included in one delay unit (for example, the delay unit U9). These code signals <1> to <n> are used for activating the corresponding delay units U1 to Un. If the code signal <x> has a logic value of "1", then the corresponding delay unit Ux is activated, where x is a positive integer between 1 and n. For example, the code signal <1> of the same control signal dll_code is input to the NAND gates N1 and N2 included in the delay unit U1, respectively. If the logic value of the code signal <1> is "1", the delay unit U1 is activated.

In addition, the delay line circuit 14 further includes a multiplexer 21. The delay units U1 to Un respectively output the unit signals unit_1 to unit_n to the multiplexer 21. The output of the NAND gate at the most downstream side in each of the delay units (for example, the last NAND gate stage N20 in the delay unit U9) is provided to the multiplexer 21 as one of the unit signals (for example, as the unit signal unit_9). The multiplexer 21 also receives the selection control signal SEL. The multiplexer 21 is configured to select and output one of the unit signals unit_1 to unit_n as the delay signal dll_clk according to the selection control signal SEL.

In the lock operation, according to the delay signal dll_clk, starting from the most upstream delay unit U1 that receives the input clock signal clk, the required delay units U1 to Ux are sequentially activated toward the downstream side until the delay amount set by the DLL control circuit 13 is achieved. The activated delay units U1 to Ux are used to delay the input clock signal clk. For example, when the delay amount set by the DLL control circuit 13 requires activating 9 delay units U1 to U9, the DLL control circuit 13 generates the selection control signal SEL indicating the selection of the delay unit U9, and generates the control signal dll_code which includes the code signals <1> to <9> for activating the delay units U1 to U9. The selection control signal SEL, and the code signals <1> to <9> having logic value of "1" are output to the delay line circuit 14. In this case, the delay units U1 to U9 are activated to delay the input clock signal clk, thereby generating the unit signals unit_1 to unit_9. Then, according to the selection control signal SEL, the unit signal unit_9 from the delay unit U9 is selected. The multiplexer 21 outputs the unit signal unit_9 as the delay signal dll_clk.

In the embodiment of FIG. 2, the stage number of NAND gates in one of the delay units U1 to Un in the delay line circuit 14 is different from the stage number of NAND gates in the other one of the delay units in the delay line circuit 14. For example, the delay unit U1 is constructed by 2 stages of NAND gates N1 and N2, while the delay unit U9 is constructed by 4 stages of NAND gates N17, N18, N19, and N20. In other words, the delay unit U1 is composed of one delay element E1, and the delay unit U9 is composed of two delay elements E9 and E10. However, the present invention is not limited thereto. As shown in FIG. 3, in the schematic diagram showing the relationship between the delay units U1 to Un and the NAND gates N1 to Nm of the delay line circuit 14, these rectangles represent the delay units U1 to Un, and their numbers are indicated in the upper left corner of each rectangle (for example, the upper left corner is 1 indicating that this rectangle is the delay unit U1), and the number of NAND gate stages included in the delay units U1 to Un is displayed in the rectangle. In this embodiment, the larger the stage number of NAND gates included, the larger the rectangle is drawn. The NAND gate row 22 is configured to make each of the delay units U1 to U8 have 2 stages of NAND gates (that is, 1 delay element), and each of the delay units U9 to U16 have 4 stages of NAND gates (that, 2 delay elements), each of the delay units U17 to U24 have 6 stages of NAND gates (that is, 3 delay elements), and each of the delay units U25 to U32 have 8 stages of NAND gates (that is, 4 delay elements).

It should be noted that in the conventional delay line circuit, each of the delay units is composed of the same number of delay elements. As shown in FIG. 4A, all delay units are constructed by 2 stages of NAND gates. As a result, when the delay amount is large, a large number of delay units need to be activated sequentially to complete the lock operation. In other words, when the delay amount is large, it takes a long time to activate the required number of delay units.

In contrast, unlike the conventional delay line circuit, in this embodiment, the number of delay elements included in at least one of the delay units U1 to Un of the delay line circuit 14 is larger than that included in the other ones of the delay units of the delay line circuit 14, and therefore the extension of the lock time Td11 can be suppressed. In detail, when the delay units U1 to Ux are activated sequentially in order to activate the delay unit Ux corresponding to the number of NAND gates required to achieve the delay amount, since the delay unit Ux on the more downstream side may include more stages of NAND gates, and thus as long as one delay unit Ux is activated, more NAND gates can be activated, such that the required delay amount can be quickly achieved. As shown in FIG. 4B, in one embodiment of the present invention, each of the delay units U1 to U8 has 2 stages of NAND gates, and each of the delay units U9 to U13 has 4 stages of NAND gates. Through clearer numbers, the following illustrates the differences in technology and effect between the conventional delay line circuit and the delay line circuit of this embodiment.

When the delay amount required for lock operation needs to activate 36 stages of NAND gates, the delay units U1 to U18, in the conventional delay line circuit as shown in FIG. 4A, are activated in sequence. In this case, as shown in FIG. 5A, the conventional delay line circuit requires 18 units of lock time to complete the lock operation. In contrast, in the delay line circuit 14 of this embodiment as shown in FIG. 4B, it only needs to activate the delay units U1 to U13 sequentially. In this case, as shown in FIG. 5B, the delay line circuit 14 of this embodiment can complete the lock operation in 13 units of lock time, thereby improving the execution efficiency of the delay locked loop 1.

In detail, in this embodiment, the stage number (4) of NAND gates constituting each of the delay units U9 to U13 on the downstream side is greater than the stage number (2) of NAND gates constituting each of the delay units U1 to U8 on the upstream side. Therefore, the activation of required NAND gates can be quickly achieved to shorten the lock time Td11. In addition, since each of the delay element is composed of, for example, two NAND gates, the number (2) of delay elements constructing each of the delay units U9 to U13 on the downstream side is larger than the number (1) of delay element constructing each of the delay units U1 to U8 on the upstream side. By this way, more appropriate control can be achieved based on the required delay amount. In short, when the delay amount is small, the lock operation corresponding to the activation of the delay units U1 to U8 on the upstream side can be completed within the predetermined execution period, and even when the delay amount is large, by activating the delay units U9 to U13 on the downstream side with more delay elements can still complete the lock operation within the predetermined execution period, thereby improving the reliability of the output of data DQS.

In the embodiment, as shown in FIG. 3, the number of NAND gates is increased by 2 for every 8 delay units (that is, the number of delay elements is increased by 1 for every 8 delay units), but the present invention is not limited thereto. The delay line circuit 14 can be configured to increase the number of delay elements by z for every y delay units starting from the delay unit U1 that receives the input clock signal clk, according to the predetermined execution period tDLLK of the DLL sequence. Where, y is a positive integer less than n, and is a positive integer. Alternatively, according to the predetermined execution period tDLLK of the DLL sequence, at least one delay-element-increment position y can be set in the delay units U1 to Un, such that each of the delay units, from the delay unit Uy located at the delay-element-increment position y to the delay unit Un (an example of the delay units located on the other end side), has more delay elements than each of the delay units, from the delay unit Uy−1 located at a previous position more upstream than the delay-element-increment position y to the delay unit U1 (an example of the delay units located on one end side).

In addition, when the delay line circuit 14 sets only one delay-element-increment position y, it is desirable to set this delay-element-increment position y on the further downstream side (an example of the other end side). As shown in FIG. 4B, in the delay line circuit 14 composed of 13 delay units U1 to U13, only one delay-element-increment position y is set, and the delay-element-increment position y is set to 9. By this way, even when the delay amount is very large, by using the delay units U9 to U13 with an increased number of delay elements, the lock operation can be ended earlier than the conventional art. In addition, a plurality of delay-element-increment positions y, y+i, . . . can be set with different spacing in the NAND gate row 22, where i is not equal to y. It is desirable that the number of delay units between these delay-element-increment positions y, y+i, . . . is smaller than the number of delay units from the downstream side up to the nearest delay-element-increment position. For example, the delay line circuit 14 with 24 delay units U1 to U24 can be configured to have 2 delay-element-increment positions y and y+i, and y is equal to 9 and i is equal to 4, such that each of the delay units U1 to U8 is constructed by 2 stages of NAND gates, each of the delay units U9 to U12 is constructed by 4 stages of NAND gates, and each of the delay units U13 to U24 is constructed by 6 stages of NAND gates. By this way, since the delay units U9 to U24 on the downstream side have more delay elements than the delay unit U1 on the most upstream side, the lock operation can be completed earlier than the conventional art.

In this embodiment, from each of the delay-element-increment position, the number of delay elements is increased by 1 (for example, increasing 2 stages of NAND gates), but the present invention is not limited thereto. For example, the delay line circuit 14 with 24 delay units U1 to U24 may be configured to have one delay-element-increment position y, and y is equal to 17, such that each of the delay units U1 to U16 is constructed by 2 stages of NAND gates, and each of the delay units U17 to U24 is constructed by 8 stages of NAND gates. For some embodiments requiring fine control, it is preferable to gradually increase the number of delay elements. For some embodiments requiring efficient lock operation, the increase in the number of delay elements can be set to be greater than 1.

Figure 6:
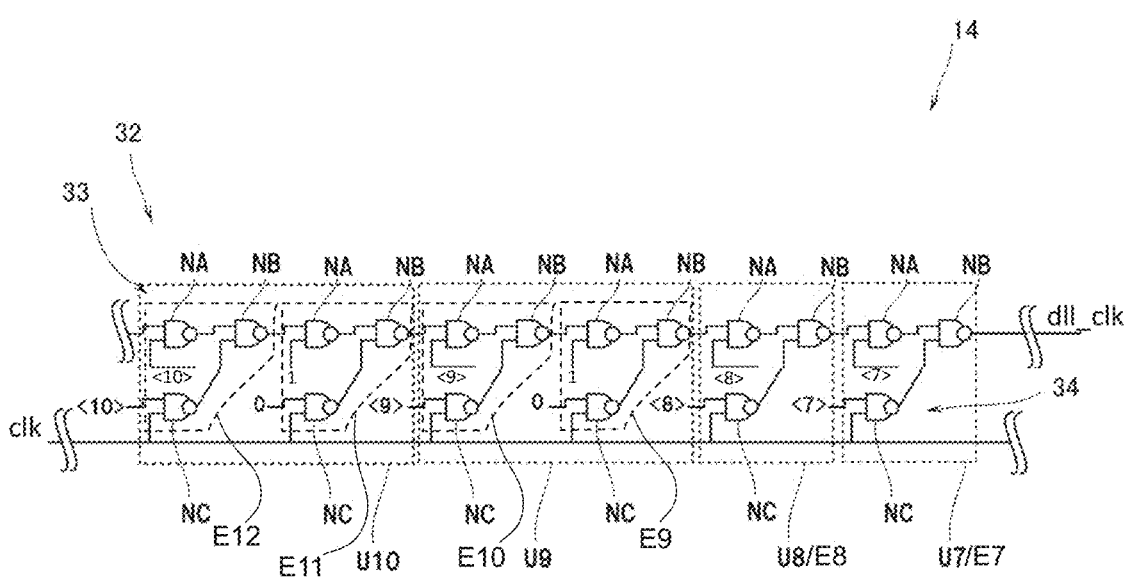
FIG. 6 is a structural diagram of another delay line circuit.

In the aforementioned first embodiment, the multiplexer 21 is provided on the output side of the delay line circuit 14, but in the second embodiment as shown in FIG. 6, the difference from the first embodiment is that the delay line circuit 14 is configured to use selectors to form delay elements (for example, the delay elements E7 to E12) without providing the multiplexer 21. In the second embodiment, the delay line circuit 14 includes n delay units U1 to Un (for example, U1 to U16, only U7 to U10 are shown for simplicity), where n is a positive integer greater than 1. Each of the delay units U1 to Un includes a least one delay element (for example, E1 to E24, only E7 to E12 are shown for simplicity) for delaying the input clock signal clk. Furthermore, among these delay units U1 to Un, the number of delay elements (for example, E9 to E10) included in at least one delay unit (for example, U9) is larger than the number of delay elements (for example, E1) included in the other delay units (for example, U1). In this embodiment, these delay units U1 to Un constitute the NAND gate row 32. It should be noted that only a portion of the NAND gate row 32 is shown in FIG. 6.

In specific, the NAND gate row 32 includes a first NAND sub-gate row 33 and a second NAND sub-gate row 34. The first NAND sub-gate row 33 is composed of a plurality of first NAND gates NA and second NAND gates NB connected in series. The second NAND sub-gate array 34 includes a plurality of third NAND gates NC respectively connected to the second NAND gates NB, and the third NAND gates NC are substantially connected in parallel. In this embodiment, each of the delay element (for example, E7~E12) includes a selector which is composed of the first NAND gate NA, the second NAND gate NB, and the third NAND gate NC.

Different from the first embodiment, in the second embodiment, the input clock signal clk is applied to the input ends of the third NAND gates NC in parallel, and the serial number (i.e., 1~n) is given to the delay units from the end side where the delay signal dll_clk is generated. In this embodiment, the delay unit U8 includes one delay element E8, and the delay unit U9 with a larger serial number includes two delay elements E9 and E10. In this embodiment, one delay-element-increment position y is set in the delay line circuit 14, and y is equal to 9. Each of the delay units from the delay unit U16 (not shown in FIG. 6) to the delay unit U9 on the upstream side of the delay-element-increment position y (i.e., the end side far away from the end side where the delay signal dll_clk is generated) has 2 delay elements. Each of the delay units U8 to U1 on the downstream side of the delay-element-increment position y (i.e., on the end side toward where the delay signal dll_clk is generated) has 1 delay element.

The second NAND gate NB of the first NAND gate row 33 receives the output of the first NAND gate NA and the output of the third NAND gate NC. The third NAND gate NC receives the input clock signal clk, and the "0" signal or the code signals <1> to <n> of the control signal dll_code (for example, the code signals <1> to <16>, only the code signals <7> to <10> is shown for simplicity). In detail, in this embodiment, in each of the delay units U1 to U16, only the third NAND gate NC on the most upstream side receives the code signals <1> to <n> of the control signal dll_code, and the rest of the third NAND gate NC receives the "0" signal. The first NAND gate NA of the most upstream delay element of the delay line circuit 14 (that is, the delay element farthest from the end side that generates the delay signal dll_clk, such as E24, not shown in FIG. 6) receives the "1" signal and the complementary code signal <n> (for example, $\langle\overline{16}\rangle$). Each of the first NAND gates NA of the other delay elements (for example, E1 to E23) receives the output of the second NAND gate NB of the previous stage, and the "1" signal or the complementary code signal $\langle\overline{1}\rangle$ to $\langle\overline{n-1}\rangle$. In detail, in this embodiment, in each of the delay units U1 to U16, only the first NAND gate NA on the most upstream side receives the complementary code signals $\langle\overline{1}\rangle$ to $\langle\overline{n}\rangle$, and the rest of the first NAND gate NA receives the "1" signal. In this embodiment, the selection control signal SEL includes code signals <1> to <n> and the complementary code signals $\langle\overline{1}\rangle$ to $\langle\overline{n}\rangle$ of the control signal dll_code.

In this embodiment, only the delay unit Ux selected by the selection control signal SEL input to the selector is activated. In the activated delay unit Ux, the input clock signal clk is delayed through the third NAND gate NC and the second NAND gate NB of the delay unit Ux, and is output to the adjacent first NAND gate NA, such that the clock signal clk is delayed and output as the delay signal dll_clk, by passing through the delay units Ux to U1 of the first NAND sub-gate row 33.

In short, in the delay line circuit 14 of this embodiment, among the delay units U1 to Un connected in series, only the delay unit Ux required to achieve the delay amount is activated. The input clock signal clk is delayed by using the delay units, from the activated delay unit Ux to the delay unit U1 that outputs the delay signal dll_clk on the downstream side. For example, when the DLL control circuit 13 is set to activate the delay unit U9, the selection control signal SEL instructing the selection of the delay unit U9 is input, so that the delay unit U9 is activated. Therefore, the delay units U1 to U9 are used in the delay operation to delay the input clock signal clk, and generate and output the delayed signal dll_clk. In specific, the DLL control circuit 13 provides the code signal <9> with a logic value of "1" to the third NAND gate NC of the most upstream delay element E10 in the delay unit U9, and provides the code signal <9> with a logic value of "0" to the remaining third NAND gates NC in the delay unit U9. The DLL control circuit 13 provides the complementary code signal <9> with the logic value of "O" to the first NAND gate NA in the delay element E10, and provides the complementary code signal with the logic value of "1" to the remaining first NAND gate NA in the delay unit U9. By this way, the delay element E10 selects the input clock signal clk as the output, and provides the input clock signal clk to the first NAND gate NA of the delay element E9. Then, the input clock signal clk is delayed by the first NAND gates NAs and the second NAND gates NBs of the delay units U1 to U8, and is output as the delay signal dll_clk. At this time, the number of NAND gate stages of the delay unit U8 for delay operation is 2 (that is, delayed by one third NAND gate NC and one second NAND gate NB), and the number of NAND gate stages of the delay unit U9 for delay operation is 4 (that is, delayed by two third NAND gates NCs and two second NAND gates NBs), and the amount of delay provided is the same as that provided by the delay units U8 and U9 of the first embodiment.

Even in this embodiment, since the number of delay elements included in each delay unit on the upstream side (that is, far away from the end side where the delay signal dll_clk is generated) of the delay-element-increment position y, is larger than the number of delay elements included in each delay unit on the downstream side (that is, towards the end side where the delay signal dll_clk is generated) of the delay-element-increment position y. Therefore, when the delay amount is large, the required number of delay elements can be used in advance by selecting the control signal SEL. As a result, it can shorten the lock time Td11. Therefore, the execution period tDLLK of the predetermined DLL sequence can also be shortened.

In the aforementioned embodiments, the delay elements are formed by NAND gates, but the invention is not limited thereto. In addition, the arrangement of the delay line circuit 14 is not particularly specified.

In the aforementioned embodiments, although the semiconductor memory device with a delay locked loop is a DRAM as an example for explanation, the present invention is not limited thereto. For example, the semiconductor memory device may be SRAM (Static Random Access Memory), flash memory, or other semiconductor memory devices.

The aforementioned embodiments and variations are described to improve understanding of the present invention and are not intended to limit the present invention. Therefore, each element disclosed in the above embodiments and variations also includes all design changes and equivalents within the technical scope of the present invention.

The configuration of the delay locked loop 1 in the aforementioned embodiment is an example, and other various configurations can be appropriately changed and adopted.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A delay locked loop (DLL), comprising:
   a DLL control circuit, configured to set amount of delay according to a phase difference between an input clock signal and an output clock signal;
   a delay line circuit, receiving the input clock signal, and configured to perform a delay operation on the input clock signal according to the amount of delay, thereby generating the output clock signal;
   wherein the delay line circuit includes a plurality of delay units, each of the plurality of delay units includes at least one delay element, and a first number of delay elements in at least one of the delay units is greater than a second number of delay elements in at least another one of the delay units;
   wherein the delay locked loop further includes:
   an input buffer, configured to buffer a received external clock signal to generate the input clock signal;
   a replica circuit, configured to generate a feedback signal according to the output clock signal; and
   a phase detection circuit, coupled between the replica circuit and the DLL control circuit, receiving the input clock signal and the feedback signal, and configured to generate a phase signal for indicating the phase difference to the DLL control circuit;
   wherein the DLL control circuit generates a selection control signal and a control signal for indicating the amount of delay according to the phase signal, and the delay line circuit activates the corresponding one of the plurality of delay units according to the selection control signal and the control signal to delay the input clock signal.

2. The delay locked loop as claimed in claim 1, wherein the plurality of delay units are connected in series;
   each of the plurality of delay units is configured to generate a unit signal, and one of the unit signals is selected as the output clock signal;
   the delay unit on a most upstream side receives the input clock signal, and each of the rest of the plurality of delay units receives the unit signal generated by the delay unit provided on its upstream.

3. The delay locked loop as claimed in claim 2, wherein the delay line circuit further comprises:
   a multiplexer, configured to receive the unit signal and the selection control signal;
   wherein the multiplexer selects one of the unit signals used as an output of the multiplexer according to the selection control signal to serve as the output clock signal.

4. The delay locked loop as claimed in claim 3, wherein according to the amount of delay, the delay line circuit uses the plurality of delay units sequentially, from one end side to the other end side, to perform the delay operation; and the number of delay elements included in the delay unit provided on the other end side is greater than the number of delay elements included in the delay unit provided on the one end side.

5. The delay locked loop as claimed in claim 4, wherein the delay line circuit is configured as:
   the number of delay elements included in each of the delay units which are provided from the other end side to a delay-element-increment position is greater than the number of delay elements included in each of the delay units provided from a previous position before the delay-element-increment position to the one end side.

6. The delay locked loop as claimed in claim 4, wherein the number of delay elements included in each of the delay units which are provided from the other end side to a delay-element-increment position is less than the number of delay elements included in each of the delay units provided from a previous position before the delay-element-increment position to the one end side.

7. The delay locked loop as claimed in claim 2, wherein each of the delay elements is formed by two NAND gates connected in series.

8. The delay locked loop as claimed in claim 1, wherein the delay line circuit is configured to set a plurality of delay-element-increment positions, and the number of delay units provided between the delay-element-increment positions is less than the number of delay units which are provided between the delay unit far away from the input clock signal and the delay-element-increment position adjacent to the faraway delay unit.

9. The delay locked loop as claimed in claim 1, wherein each of the delay elements comprises:
   a first NAND gate;
   a second NAND gate, connected in series with the first NAND gate, and a first input end of the second NAND gate coupled to an output end of the first NAND gate; and
   a third NAND gate, receiving the input clock signal and the selection control signal, and an output end of the third NAND gate coupled to a second input end of the second NAND gate.

10. The delay locked loop as claimed in claim 9, wherein the output end of the second NAND gate in one of the plurality of delay elements is coupled to the input end of the first NAND gate in the other of the plurality of delay elements, thereby forming a first NAND sub-gate row with alternating configuration of the first NAND gates and the second NAND gates, and the delay line circuit outputs the output clock signal through one end of the first NAND sub-gate row.

11. The delay locked loop as claimed in claim 10, wherein the number of delay units included in one of the delay units farther from the one end side of the first NAND sub-gate row is greater than the number of delay units included in one of the delay units closer to the one end side of the first NAND sub-gate row.

12. The delay locked loop as claimed in claim 10, wherein one of the plurality of delay units is activated according to the selection control signal, and in the activated delay unit, the input clock signal is selected as the output of the delay element and transmitted through the first NAND sub-gate row to the one end side of the first NAND sub-gate row to serve as the output clock signal.

13. The delay locked loop as claimed in claim 10, wherein the delay line circuit sequentially uses the delay units which are provided on the positions from a selected one of the delay units according to the selection control signal, toward the end side of the first NAND sub-gate row to perform the delay operation, and the number of delay elements included in the selected one of the delay units is greater than the number of at least one delay elements included in the delay unit adjacent to the end side of the first NAND sub-gate row.

14. The delay locked loop as claimed in claim 10, wherein the delay line circuit is configured as:

the number of delay elements included in each of the delay units provided from the end side of the first NAND sub-gate row to the previous position before a delay-element-increment position is less than the number of delay elements included in each of the delay units provided from the delay-element-increment position to the other end side of the first NAND sub-gate row.

15. The delay locked loop as claimed in claim 10, wherein the selection control signal includes a plurality of code signals and a plurality of complementary code signals, each of the code signals is provided to the third NAND gate of a corresponding delay unit, and each of the complementary code signals is provided to the other input end of the first NAND gate of the corresponding delay unit.

16. The delay locked loop as claimed in claim 10, wherein the input end of the first NAND gate of one of the delay elements that is farthest from the end side of the first NAND sub-gate row receives a fixed first logic value.

17. The delay locked loop as claimed in claim 16, wherein the delay line circuit is configured as:

only the third NAND gate farthest from the end side of the first NAND sub-gate row receives a corresponding one of the code signals, and the remaining third NAND gates receive a fixed second logic value, and only the first NAND gate farthest from the end side of the first NAND sub-gate row receives a corresponding one of the complementary code signals, and the remaining first NAND gates receive the fixed first logic value.

18. A semiconductor memory device comprising:

the delay locked loop of claim 1; and an output buffer, receiving the output clock signal, and control data output according to the output clock signal.

\* \* \* \* \*